United States Patent
Chiang et al.

(10) Patent No.: US 8,741,712 B2
(45) Date of Patent: Jun. 3, 2014

(54) LEAKAGE REDUCTION IN DRAM MIM CAPACITORS

(71) Applicants: Tony P. Chiang, Campbell, CA (US); Wim Y. Deweerd, San Jose, CA (US); Sandra G Malhotra, San Jose, CA (US)

(72) Inventors: Tony P. Chiang, Campbell, CA (US); Wim Y. Deweerd, San Jose, CA (US); Sandra G Malhotra, San Jose, CA (US)

(73) Assignees: Intermolecular, Inc., San Jose, CA (US); Elpidia Memory, Inc., Tokyo (JP)

( * ) Notice: Subject to any disclaimer, the term of this patent is extended or adjusted under 35 U.S.C. 154(b) by 0 days.

(21) Appl. No.: 13/621,910

(22) Filed: Sep. 18, 2012

(65) Prior Publication Data

US 2014/0080282 A1  Mar. 20, 2014

(51) Int. Cl.
  *H01L 21/8242* (2006.01)
  *H01L 21/20* (2006.01)
  *H01L 21/4763* (2006.01)

(52) U.S. Cl.
  USPC .......... 438/240; 438/253; 438/396; 438/608; 438/648; 438/785; 438/957; 427/79; 427/126.3

(58) Field of Classification Search
  USPC ......... 438/240, 253, 396, 608, 648, 685, 686, 438/785, 957; 427/79, 126.3; 257/E21.01, 257/E21.208
  See application file for complete search history.

(56) References Cited

U.S. PATENT DOCUMENTS

| | | | |
|---|---|---|---|
| 6,093,944 A * | 7/2000 | VanDover | 257/310 |
| 6,387,749 B1 * | 5/2002 | Lim | 438/240 |
| 6,617,639 B1 * | 9/2003 | Wang et al. | 257/324 |
| 7,271,055 B2 * | 9/2007 | Lee et al. | 257/310 |
| 8,299,507 B2 * | 10/2012 | Shimizu et al. | 257/288 |
| 2005/0127395 A1 * | 6/2005 | Saigoh et al. | 257/127 |
| 2007/0045752 A1 * | 3/2007 | Forbes et al. | 257/387 |
| 2007/0066012 A1 * | 3/2007 | Ohtsuka et al. | 438/250 |
| 2007/0172681 A1 * | 7/2007 | Demaray et al. | 428/469 |
| 2009/0067256 A1 * | 3/2009 | Bhattacharyya et al. | 365/185.28 |
| 2009/0173979 A1 * | 7/2009 | Ahn et al. | 257/296 |
| 2009/0297696 A1 * | 12/2009 | Pore et al. | 427/79 |
| 2009/0321707 A1 * | 12/2009 | Metz et al. | 257/4 |
| 2010/0224916 A1 * | 9/2010 | Shimizu et al. | 257/288 |
| 2011/0204475 A1 * | 8/2011 | Rui et al. | 257/532 |
| 2012/0119327 A1 * | 5/2012 | Kwon et al. | 257/532 |
| 2012/0205610 A1 * | 8/2012 | Phatak et al. | 257/4 |

* cited by examiner

*Primary Examiner* — Charles Garber
*Assistant Examiner* — Ron Pompey

(57) ABSTRACT

A method for forming a DRAM MIM capacitor stack having low leakage current involves the use of a first electrode that serves as a template for promoting the high-k phase of a subsequently deposited dielectric layer. The high-k dielectric layer includes a doped material that can be crystallized after a subsequent annealing treatment. An amorphous blocking is formed on the dielectric layer. The thickness of the blocking layer is chosen such that the blocking layer remains amorphous after a subsequent annealing treatment. A second electrode layer compatible with the blocking layer is formed on the blocking layer.

20 Claims, 7 Drawing Sheets

LEAKAGE REDUCTION IN DRAM MIM CAPACITORS

This document relates to the subject matter of a joint research agreement between Intermolecular, Inc. and Elpida Memory, Inc.

FIELD OF THE DISCLOSURE

The present invention generally relates to the field of dynamic random access memory (DRAM), and more particularly to dielectric material processing for improved DRAM performance.

BACKGROUND OF THE DISCLOSURE

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_0 \frac{A}{d} \qquad \text{(Eqn. 1)}$$

where $\varepsilon_o$ represents the vacuum permittivity.

The dielectric constant is a measure of a material's polarizability. Therefore, the higher the dielectric constant of a material, the more charge the capacitor can hold. Therefore, if the k-value of the dielectric is increased, the area of the capacitor can be decreased and maintain the desired cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally <$10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

One class of high k dielectric materials possessing the characteristics required for implementation in advanced DRAM capacitors are high k metal oxide materials. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, etc. Titanium oxide and zirconium oxide are two specific examples of metal oxide dielectric materials which display significant promise in terms of serving as a high k dielectric material for implementation in DRAM capacitors.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k value, significantly higher than that of SiO$_2$ (k=3.9). For DRAM capacitors, the goal is to utilize dielectric materials with k values greater than about 40. Such materials are generally classified as high k materials. Representative examples of high k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high k material's EOT is calculated using a normalized measure of silicon dioxide (SiO$_2$ k=3.9) as a reference, given by:

$$EOT = \frac{3.9}{\kappa} \cdot d \qquad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

Generally, as the dielectric constant of a material increases, the band gap of the material decreases. For example. The rutile phase of TiO$_2$ has a k value of about 80 and a band gap of about 3.0 eV while ZrO$_2$ in the tetragonal phase has a k value of about 43 and a band gap of about 5.8 eV. The low band gap may lead to high leakage current in the device. As a result, without the utilization of countervailing measures, capacitor stacks implementing high k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof include other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the high-k rutile-phase of $TiO_2$ as discussed previously. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$ and have higher resistivity than $MoO_2$. For example, $MoO_3$ (the most oxygen-rich phase) has an orthorhombic crystal structure and is a dielectric.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in DRAM MIM capacitors with $TiO_2$ or doped-$TiO_2$ high k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference for all purposes. However, these DRAM MIM capacitors have continued to use noble metal (i.e. Ru) materials for the second electrode (i.e. top electrode).

After the formation of the second electrode, the capacitor stack is then subjected to a post metallization anneal (PMA) treatment. The PMA treatment serves to crystallize the second electrode and to anneal defects in the dielectric and interface states that are formed at the dielectric/second electrode interface during the deposition. Also, if there is no post dielectric anneal (PDA) treatment done before metallization, the PMA treatment can serve to crystallize the dielectric layer to improve the k value and fill oxygen vacancies. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference for all purposes. As discussed above, $MoO_2$ is sensitive to oxidation to form oxygen-rich compounds that negatively impacts its performance as an electrode material. The reducing atmosphere anneal processes discussed previously with respect to the use of crystalline $MoO_2$ as a first electrode are not an option at this stage of the device manufacture because they would degrade the performance of the dielectric layer through the formation of oxygen vacancies. Titanium oxide high-k dielectric materials are especially sensitive to processing conditions and increases in the leakage current are observed, likely due to the formation of oxygen vacancies.

As discussed previously, the rutile phase of titanium oxide is an attractive candidate high k dielectric material with a k-value in excess of about 80 depending on processing conditions. The high k-value should allow the formation of MIM capacitor stacks with low EOT values within the physical thickness constraints of advanced DRAM technologies. The use of crystalline $MoO_2$ would be attractive as a first electrode since it would serve as a good template to promote the formation of the rutile phase of titanium oxide. Ideally, the crystalline $MoO_2$ would be used as the second electrode as well to form a symmetric MIM stack. However, currently Ru is used for the second electrode due to integration issues surrounding the use of $MoO_2$ as the second electrode. As discussed previously, both $MoO_2$ and titanium oxide are very sensitive to the environment used during the various annealing steps. The oxidation of $MoO_2$ to $MoO_{2+x}$ and the loss of oxygen in titanium oxide to form oxygen vacancies both contribute to the higher leakage current observed in MIM stacks using these materials.

Leakage current in capacitor dielectric materials can be due to Schottky emission, Frenkel-Poole defects (e.g. oxygen vacancies ($V_{ox}$) or grain boundaries), or Fowler-Nordheim tunneling. Schottky emission, also called thermionic emission, is a common mechanism and is the thermally activated flow of charge over an energy barrier whereby the effective barrier height of a MIM capacitor controls leakage current. The nominal barrier height is a function of the difference between the work function of the electrode and the electron affinity of the dielectric. The electron affinity of a dielectric is closely related to the conduction band offset of the dielectric. The Schottky emission behavior of a dielectric layer is generally determined by the properties of the dielectric/electrode interface. Frenkel-Poole emission allows the conduction of charges through a dielectric layer through the interaction with defect sites such as vacancies, grain boundaries, and the like. As such, the Frenkel-Poole emission behavior of a dielectric layer is generally determined by the dielectric layer's bulk properties. Fowler-Nordheim emission allows the conduction of charges through a dielectric layer through direct tunneling without any intermediary interaction with e.g. defects. As such, the Fowler-Nordheim emission behavior of a dielectric layer is generally determined by the physical thickness of the dielectric layer. This leakage current is a primary driving force in the adoption of high-k dielectric materials. The use of high-k materials allows the physical thickness of the dielectric layer to be as thick as possible while maintaining the required capacitance (see Eqn 1 above).

As discussed previously, materials with a high k value generally have a small band gap. The small band gap leads to high leakage current through the Schottky emission mechanism due to the small barrier height. The leakage current may be reduced through the use of a blocking layer that has a higher band gap. Therefore, there is a need to develop methods for forming capacitor stacks that incorporate blocking layers to reduce the leakage current.

SUMMARY OF THE DISCLOSURE

In some embodiments, a crystalline $MoO_2$ first electrode is used to promote the formation of the rutile phase of a titanium oxide dielectric layer that is subsequently formed. The $MoO_2$ first electrode may be annealed to increase the crystallinity and to reduce unwanted $MoO_{2+x}$ phases that may be present. The titanium oxide dielectric layer may be doped to reduce the leakage current. The titanium oxide dielectric layer may be a single layer or may be formed from multiple layers wherein some a doping level is varied between the multiple layers. An amorphous blocking layer is formed above the titanium oxide dielectric layer. The amorphous blocking layer includes a ternary metal oxide dielectric material with a k value between about 20 and about 50 and the band gap of the blocking layer is greater than about 4.8 eV. Examples of suitable blocking layer materials include $LaAlO_3$, $GdScO_3$, $SrZrO_4$, $LaLuO_3$, $DyScO_3$, $HfLaO_x$, $ZrLaO_x$, and $TiLaO_x$ or combinations thereof. The amorphous blocking layer reduces the leakage current of the capacitor stack. The first electrode layer, titanium oxide dielectric layer, and blocking layer may be annealed to increase the crystallinity of the titanium oxide dielectric layer and to reduce the concentration of oxygen vacancies that may be present in the titanium oxide dielectric layer. A second electrode is formed on top of the amorphous blocking layer. The second electrode is compatible with the amorphous blocking layer and is compatible with current DRAM manufacturing process flows.

In some embodiments, a first electrode is formed. The first electrode may receive a surface treatment before the subsequent formation of a zirconium oxide-based high-k dielectric layer. The zirconium oxide dielectric layer may include a dopant to reduce the leakage current. As used herein, a "dopant" is a minor constituent (generally <20 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials. The zirconium oxide dielectric layer may be a single layer or may be formed from multiple layers wherein a doping level is varied between the multiple layers. An amorphous blocking layer is formed above the zirconium oxide dielectric layer. The amorphous blocking layer is a ternary metal oxide dielectric material with a k value between about 20 and about 50 and the band gap of the blocking layer is greater than about 4.8 eV. Examples of suitable blocking layer materials include $LaAlO_3$, $GdScO_3$, $SrZrO_4$, $LaLuO_3$, $DyScO_3$, $HfLa_x$, $ZrLaO_x$, and $TiLaO_x$ or combinations thereof. The amorphous blocking layer reduces the leakage current of the capacitor stack. The first electrode layer, zirconium oxide dielectric layer, and blocking layer may be annealed to increase the crystallinity of the zirconium oxide dielectric layer and to reduce the concentration of oxygen vacancies that may be present in the zirconium oxide dielectric layer. A second electrode is formed on top of the amorphous blocking layer. The second electrode is compatible with the amorphous blocking layer and is compatible with current DRAM manufacturing process flows.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

It must be noted that as used herein and in the claims, the singular forms "a," "and" and "the" include plural referents unless the context clearly dictates otherwise. Thus, for example, reference to "a layer" also includes two or more layers, and so forth. As an example, those skilled in the art will understand that an "electrode layer" may include a single layer or may include a "bilayer" of two materials.

Figure 1:
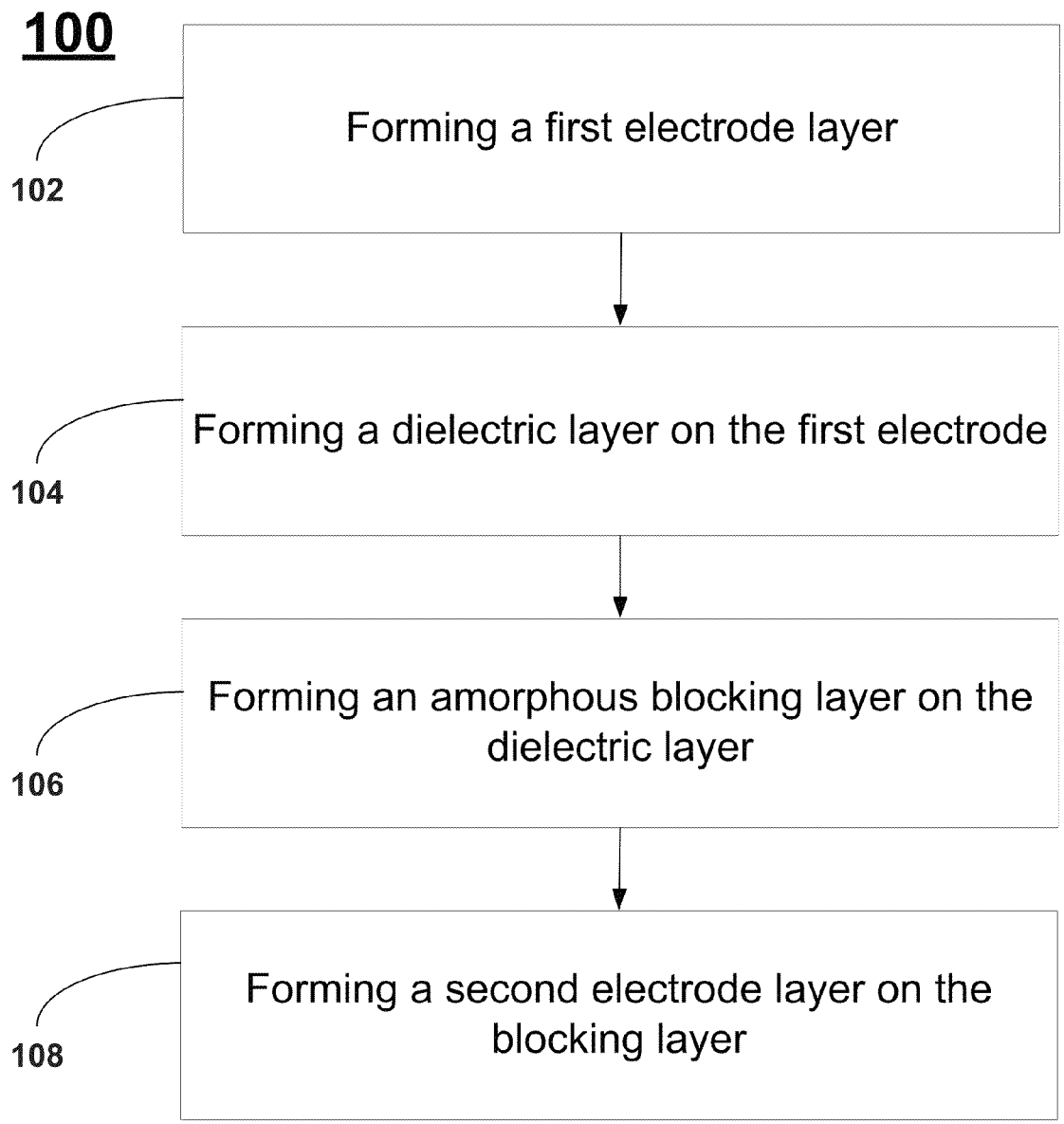
FIG. 1 illustrates a flow chart illustrating a method for fabricating a DRAM capacitor stack in accordance with some embodiments.

FIG. 1 describes a method, 100, for fabricating a DRAM capacitor stack. The initial step, 102, involves forming a first electrode layer on a substrate. Examples of suitable electrode materials include metals, metal alloys, conductive metal oxides, conductive metal silicides, conductive metal nitrides, or combinations thereof. A particularly interesting class of materials is the conductive metal oxides. Optionally, the first electrode layer can then be subjected to an annealing process (not shown). The next step, 104, involves forming a dielectric layer on the first electrode layer. The next step, 106, includes forming an amorphous blocking layer on the dielectric layer. Optionally, the first electrode layer, the dielectric layer, and the blocking layer can then be subjected to an annealing process (not shown). The next step, 108, includes forming a second electrode layer on the blocking layer to complete the formation of the capacitor stack. Typically, the capacitor stack is then subjected to a PMA anneal treatment.

Those skilled in the art will appreciate that each of the first electrode layer, the dielectric layer, the blocking layer, and the second electrode layer used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

In FIGS. 2, 3, 6, and 7 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
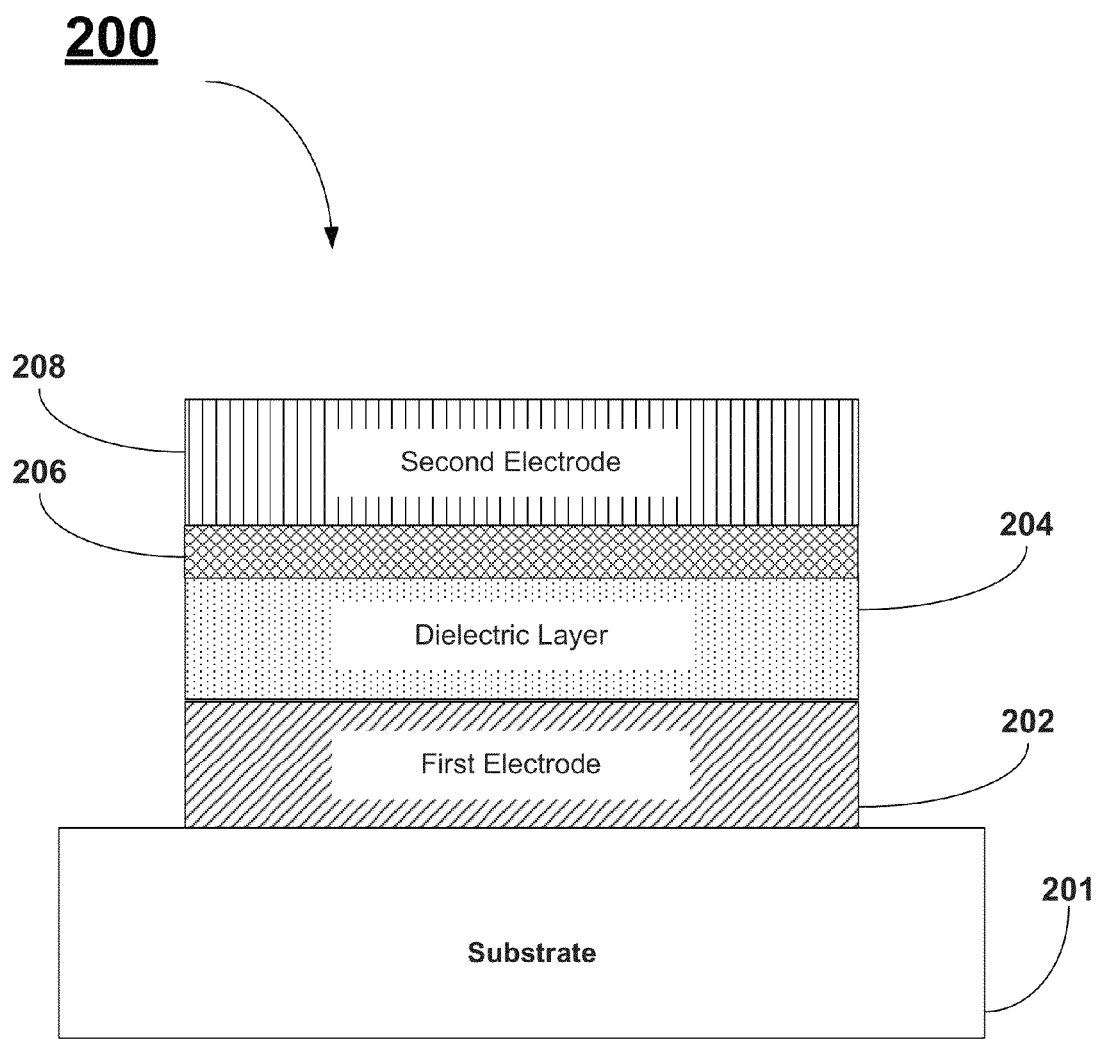
FIG. 2 illustrates a simplified cross-sectional view of a DRAM capacitor stack fabricated in accordance with some embodiments.

FIG. 2 illustrates a simple capacitor stack, 200, consistent with a DRAM MIM capacitor stack according to some embodiments including a crystalline metal oxide first electrode layer, a crystalline, doped high k dielectric layer, an amorphous blocking layer, and a second electrode layer. First electrode layer, 202, is formed on substrate, 201. Generally, the substrate has already received several processing steps in the manufacture of a full DRAM device. First electrode layer, 202, includes one of metals, metal alloys, conductive metal oxides, conductive metal nitrides, conductive metal silicides, or combinations thereof, etc. For this example, first electrode layer, 202, includes a conductive metal oxide that may serve to promote the rutile phase of titanium oxide. Examples of such conductive metal oxides include the conductive compounds of molybdenum oxide, tungsten oxide, ruthenium oxide, iron oxide, iridium oxide, chromium oxide, manganese oxide, tin oxide, cobalt oxide, or nickel oxide. A specific electrode material of interest is the crystalline compound of molybdenum oxide. Advantageously, the first electrode may include two layers wherein a titanium nitride layer is used as a highly conductive base layer and the molybdenum oxide is used as a second layer of the first electrode.

Optionally, first electrode layer, 202, can be annealed to crystallize the material. In the case of crystalline molybdenum oxide, it is advantageous to anneal the first electrode layer in a reducing atmosphere such as Ar, $N_2$, or forming gas to prevent the formation of oxygen-rich compounds as discussed previously.

In some embodiments, a DRAM MIM capacitor stack includes a first electrode including between about 5 nm and about 10 nm of molybdenum oxide formed above a substrate. The molybdenum oxide electrode material is formed at a process temperature between about 125 C and 400 C using an ALD process technology. Optionally, the substrate with the first electrode is then annealed in a reducing atmosphere including between about 0% and about 20% $H_2$ in $N_2$ and advantageously between about 5% and about 10% $H_2$ in $N_2$ between 300 C and 600 C for between about 1 millisecond and about 60 minutes as discussed previously. As discussed previously, the molybdenum oxide may be deposited above a titanium nitride base layer.

In the next step, dielectric layer, 204, would then be formed above the annealed first electrode layer, 202. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or doped versions of the same. These dielectric materials may be formed as a single layer or may be formed as a hybrid or nanolaminate structure. A specific dielectric material of interest is titanium oxide doped with one of Al, Ce, Co, Er, Ga, Gd, Ge, Hf, In, La, Lu, Mg, Mn, Nd, Pr, Sc, Si, Sn, Sr, Y, Zr, or combinations thereof. A specific dielectric material of interest is titanium oxide doped with Al to between about 5 atomic and about 15 atomic % Al (Al/(Al+Ti) atomic %).

In some embodiments, the, doped dielectric layer includes between about 6 nm to about 10 nm of titanium oxide wherein at least 30% of the titanium oxide is present in the rutile phase. Generally, the titanium oxide dielectric layer may either be a single film or may include a nanolaminate. Advantageously, the titanium oxide material is doped with Al at a concentration between about 5 atomic % and about 15 atomic % Al. The titanium oxide dielectric layer is formed at a process temperature between about 200 C and 350 C using an ALD process technology.

In the next step, amorphous blocking layer, 206, would then be formed on the crystalline, doped dielectric layer, 204. A wide variety of dielectric materials have been targeted for use as blocking layers in DRAM capacitors. The amorphous blocking layer material is selected to have a high band gap (e.g. greater then about 4.8 eV) and also have a relatively high k value. As discussed previously, generally, the band gap decreases as the k value increases. However, some ternary metal oxide materials maintain a high band gap while exhibiting reasonable k values (e.g. k values greater than about 20). Examples of suitable ternary metal oxide blocking layer materials include $LaAlO_3$, $GdScO_3$, $SrZrO_4$, $LaLuO_3$, $DyScO_3$, $HfLaO_x$, $ZrLaO_x$, $TiLaO_x$ or combinations thereof. These dielectric materials may be formed as a single layer or may be formed as a hybrid or nanolaminate structure. The blocking layer is formed at a process temperature between about 200 C and 350 C using an ALD process technology. The composition of the blocking layer is selected such that the blocking layer remains amorphous (<about 30% crystalline as determined by x-ray diffraction (XRD)) after subsequent annealing treatments. The blocking layer needs to be thick enough that it forms a continuous layer. Therefore, the minimum thickness is about 0.5 nm. Additionally, the blocking layer should be thin enough that it remains amorphous after subsequent annealing treatments. Therefore, the maximum thickness is about 2.0 nm. Advantageously, the thickness of the blocking layer is in the range from about 0.7 nm to about 1.5 nm. The thickness of the blocking layer is typically less than or equal to about 25% of the total dielectric thickness of the DRAM MIM capacitor.

The substrate with the first electrode layer, a doped high k dielectric layer, and an amorphous blocking layer is then annealed in an oxidizing atmosphere including between about 0% $O_2$ to about 100% $O_2$ in $N_2$ and advantageously between about 0% $O_2$ to about 20% $O_2$ in $N_2$ at temperatures between about 300 C to about 600 C for between about 1 millisecond to about 60 minutes. The doped high k dielectric layer will be crystalline (> about 30% crystalline as determined by XRD) after the anneal.

In the next step, the second electrode layer, 208, is formed above blocking layer, 206 to complete the formation of the capacitor stack. The second electrode layer may include one of, metals, metal alloys, conductive metal oxides, conductive metal nitrides, conductive metal silicides, or combinations thereof, etc. Examples of suitable materials for the second electrode layer include cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof. The capacitor stack may receive a PMA treatment as discussed previously.

DRAM MIM capacitors with the configuration illustrated in FIG. 2 will exhibit low leakage current due to the current blocking properties of the amorphous blocking layer. The higher band gap (i.e. > about 4.8 eV) of the blocking layer reduces the leakage current due to the Schottky emission mechanism. The barrier height between the amorphous blocking layer and the second electrode also reduces the leakage current due to the Schottky emission mechanism. Additionally, the DRAM MIM capacitor will exhibit low EOT values due to the high k value of the crystalline, doped high k dielectric layer. A further benefit of the DRAM MIM capacitor stack illustrated in FIG. 2 is that it is easy to integrate into existing DRAM manufacturing process flows. The use, treatment, materials compatibility, reliability, etc. of metal nitride second electrode materials are well established. Therefore, the DRAM MIM capacitor stack illustrated in FIG. 2 represents an opportunity to integrate the benefits of the molybdenum oxide first electrode and the high k properties of doped titanium oxide into the DRAM MIM manufacturing process without having to adapt to the use of new material as a second electrode.

FIG. 2 will be used again for the discussion of a second example. FIG. 2 illustrates a simple capacitor stack, 200, consistent with a DRAM MIM capacitor stack according to some embodiments including a metal nitride first electrode layer, a crystalline, doped high k dielectric layer, an amorphous blocking layer, and a second electrode layer. First electrode layer, 202, is formed above substrate, 201. Generally, the substrate has already received several processing steps in the manufacture of a full DRAM device. First electrode layer, 202, includes one of metals, metal alloys, conductive metal oxides, conductive metal nitrides, conductive metal silicides, or combinations thereof, etc. For this example, first electrode layer, 202, includes a conductive metal nitride. Examples of such conductive metal nitrides include the conductive compounds of cobalt nitride, molybdenum nitride, nickel nitride, tantalum nitride, titanium nitride, tungsten nitride, vanadium nitride, or combinations thereof. A specific electrode material of interest is titanium nitride.

Optionally, first metal nitride electrode layer, 202, can receive a surface treatment prior to the formation of the dielectric layer. The surface treatment serves to protect the titanium nitride electrode material from oxidation during the formation of the dielectric layer. Examples of such treatments are described in U.S. patent application Ser. No. 13/051,531 filed on Mar. 18, 2011, which is herein incorporated by reference for all purposes.

In some embodiments of a DRAM MIM capacitor stack includes a first electrode including between about 5 nm and about 10 nm of titanium nitride formed above a substrate. The titanium nitride electrode material is formed at a process temperature between about 125 C and 400 C using an ALD or CVD process technology. Optionally, the substrate with the first electrode is then treated as discussed previously.

In the next step, dielectric layer, 204, would then be formed above the annealed first electrode layer, 202. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or doped versions of the same. These dielectric materials may be formed as a single layer or may be formed as a hybrid or nanolaminate structure. A specific dielectric material of interest is zirconium oxide doped with one of Al, Ce, Co, Er, Ga, Gd, Ge, Hf, In, La, Lu, Mg, Mn, Nd, Pr, Sc, Si, Sn, Sr, Y, or combinations thereof. A specific dielectric material of interest is zirconium oxide doped with Al to between about 5 atomic and about 15 atomic % Al (Al/(Al+Zr) atomic %).

In some embodiments, the, doped dielectric layer includes between about 6 nm to about 10 nm of zirconium oxide wherein at least 30% of the zirconium oxide is present in the tetragonal phase. Generally, the zirconium oxide dielectric layer may either be a single film or may include a nanolaminate. Advantageously, the zirconium oxide material is doped with Al at a concentration between about 5 atomic % and about 15 atomic % Al. The zirconium oxide dielectric layer is formed at a process temperature between about 200 C and 350 C using an ALD process technology.

In the next step, amorphous blocking layer, 206, would then be formed above the crystalline, doped dielectric layer, 204. A wide variety of dielectric materials have been targeted for use as blocking layers in DRAM capacitors. The amorphous blocking layer material is selected to have a high band gap (e.g. greater then about 4.8 eV) and also have a relatively high k value. As discussed previously, generally, the band gap decreases as the k value increases. However, some ternary metal oxide materials maintain a high band gap while exhibiting reasonable k values (e.g. k values greater than about 20). Examples of suitable blocking layer materials include ternary metal oxides such as $LaAlO_3$, $GdScO_3$, $SrZrO_4$, $LaLuO_3$, $DyScO_3$, $HfLaO_x$, $ZrLaO_x$, $TiLaO_x$ or combinations thereof. These dielectric materials may be formed as a single layer or may be formed as a hybrid or nanolaminate structure. The blocking layer is formed at a process temperature between about 200 C and 350 C using an ALD process technology. The composition of the blocking layer is selected such that the blocking layer remains amorphous (<about 30% crystalline as determined by x-ray diffraction (XRD)) after subsequent annealing treatments. The blocking layer needs to be thick enough that it forms a continuous layer. Therefore, the minimum thickness is about 0.5 nm. Additionally, the blocking layer should be thin enough that it remains amorphous after subsequent annealing treatments. Therefore, the maximum thickness is about 2.0 nm. Advantageously, the thickness of the blocking layer is in the range from about 0.7 nm to about 1.5 nm. The thickness of the blocking layer is typically less than or equal to about 25% of the total dielectric thickness of the DRAM MIM capacitor.

The substrate with the first electrode layer, a doped high k dielectric layer, and an amorphous blocking layer is then annealed in an oxidizing atmosphere including between about 0% $O_2$ to about 100% $O_2$ in $N_2$ and advantageously between about 0% $O_2$ to about 20% $O_2$ in $N_2$ at temperatures between about 300 C to about 600 C for between about 1 millisecond to about 60 minutes. The doped high k dielectric layer will be crystalline (> about 30% crystalline as determined by XRD) after the anneal.

In the next step, the second electrode layer, 208, is formed above blocking layer, 206 to complete the formation of the capacitor stack. The second electrode layer may include one of, metals, metal alloys, conductive metal oxides, conductive metal nitrides, conductive metal silicides, or combinations thereof, etc. Examples of suitable materials for the second electrode layer include cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof. The capacitor stack may receive a PMA treatment as discussed previously.

DRAM MIM capacitors with the configuration illustrated in FIG. 2 will exhibit low leakage current due to the current blocking properties of the amorphous blocking layer. The higher band gap (i.e. > about 4.8 eV) of the blocking layer reduces the leakage current due to the Schottky emission mechanism. The barrier height between the amorphous blocking layer and the second electrode also reduces the leakage current due to the Schottky emission mechanism. Additionally, the DRAM MIM capacitor will exhibit low EOT values due to the high k value of the crystalline, doped high k dielectric layer. A further benefit of the DRAM MIM capacitor stack illustrated in FIG. 2 is that it is easy to integrate into existing DRAM manufacturing process flows. The use, treatment, materials compatibility, reliability, etc. of metal nitride second electrode materials are well established. Therefore, the DRAM MIM capacitor stack illustrated in FIG. 2 represents an opportunity to extend the benefits and the high k properties of doped zirconium oxide into the DRAM MIM manufacturing process of future device technologies without having to adapt to the use of new materials.

Figure 3:
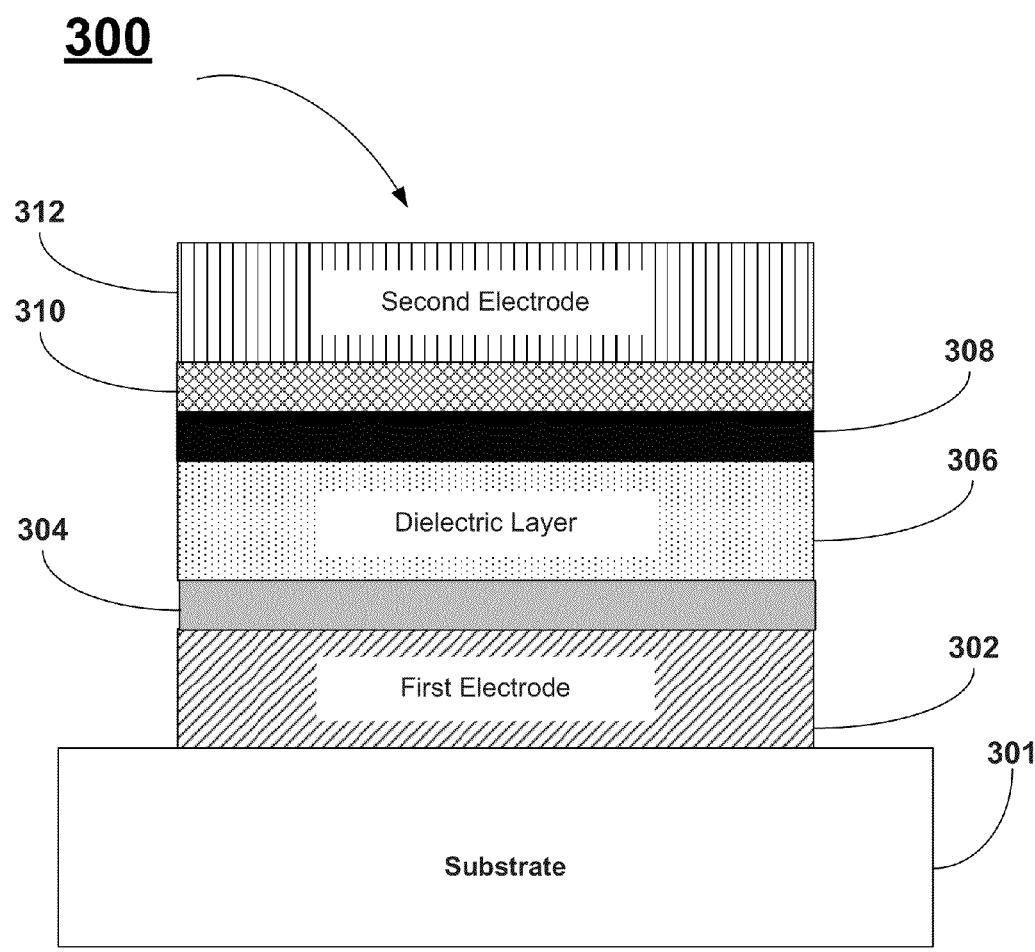
FIG. 3 illustrates a simplified cross-sectional view of a DRAM capacitor stack fabricated in accordance with some embodiments.

FIG. 3 illustrates a simple capacitor stack, 300, consistent with a DRAM MIM capacitor stack according to some embodiments including a metal nitride first electrode layer, a first interface layer (e.g. a "flash" layer), a crystalline, doped high k dielectric layer, a second interface layer, an amorphous blocking layer, and a second electrode layer. First electrode layer, 302, is formed above substrate, 301. Generally, the substrate has already received several processing steps in the manufacture of a full DRAM device. First electrode layer, 302, includes one of metals, metal alloys, conductive metal oxides, conductive metal nitrides, conductive metal silicides, or combinations thereof, etc. For this example, first electrode layer, 302, includes a conductive metal nitride. Examples of such conductive metal nitrides include the conductive compounds of cobalt nitride, molybdenum nitride, nickel nitride, tantalum nitride, titanium nitride, tungsten nitride, vanadium nitride, and others. A specific electrode material of interest is titanium nitride.

Optionally, first metal nitride electrode layer, 302, can receive a surface treatment prior to the formation of the dielectric layer. The surface treatment serves to protect the titanium nitride electrode material from oxidation during the formation of the dielectric layer. Examples of such treatments are described in U.S. patent application Ser. No. 13/051,531 filed on Mar. 18, 2011, which is herein incorporated by reference for all purposes.

In some embodiments, a DRAM MIM capacitor stack includes a first electrode including between about 5 nm and about 10 nm of titanium nitride formed on a substrate. The titanium nitride electrode material is formed at a process temperature between about 125 C and 400 C using an ALD or CVD process technology. Optionally, the substrate with the first electrode is then treated as discussed previously.

First interface layer, 304, is formed above first electrode layer, 302. First interface layer, 304, serves to protect the metal nitride first electrode layer from oxidation during the formation of the dielectric layer. Typically, the first interface layer is a metal oxide wherein the metal has a high affinity for oxygen. A typical example of a suitable metal oxide is titanium oxide. The first interface layer is formed at a process temperature between about 200 C and 350 C using an ALD process technology.

In the next step, dielectric layer, 306, would then be formed on the first interface layer, 304. A wide variety of dielectric materials have been targeted for use in DRAM capacitors. Examples of suitable dielectric materials include aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or doped versions of the same. These dielectric materials may be formed as a single layer or may be formed as a hybrid or nanolaminate structure. A specific dielectric material of interest includes zirconium oxide doped with one of Al, Ce, Co, Er, Ga, Gd, Ge, Hf, In, La, Lu, Mg, Mn, Nd, Pr, Sc, Si, Sn, Sr, Y, or combinations thereof. A specific dielectric material of interest includes zirconium oxide doped with Al to between about 5 atomic % and about 15 atomic % Al (Al/Al+Zr) atomic %).

In a specific example, the, doped dielectric layer includes between about 6 nm to about 10 nm of zirconium oxide wherein at least 30% of the zirconium oxide is present in the tetragonal phase. Generally, the zirconium oxide dielectric layer may either be a single film or may include a nanolaminate. Advantageously, the zirconium oxide material is doped with Al at a concentration between about 5 atomic % and about 15 atomic % Al. The zirconium oxide dielectric layer is formed at a process temperature between about 200 C and 350 C using an ALD process technology.

Second interface layer, 308, is formed above dielectric layer, 306. Second interface layer, 308, typically has a high band gap and serves as a current blocking layer within the dielectric material. Typically, the second interface layer is a metal oxide. A typical example of a suitable metal oxide is aluminum oxide. The second interface layer is formed at a process temperature between about 200 C and 350 C using an ALD process technology.

In the next step, amorphous blocking layer, 310, would then be formed above the second interface layer, 308. A wide variety of dielectric materials have been targeted for use as blocking layers in DRAM capacitors. The amorphous blocking layer material is selected to have a high band gap (e.g. greater then about 4.8 eV) and also have a relatively high k value. As discussed previously, generally, the band gap decreases as the k value increases. However, some ternary metal oxide materials maintain a high band gap while exhibiting reasonable k values (e.g. k values greater than about 20). Examples of suitable blocking layer materials include $LaAlO_3$, $GdScO_3$, $SrZrO_4$, $LaLuO_3$, $DyScO_3$, $HfLaO_x$, $ZrLaO_x$, and $TiLaO_x$ or combinations thereof. These dielectric materials may be formed as a single layer or may be formed as a hybrid or nanolaminate structure. The blocking layer is formed at a process temperature between about 200 C and 350 C using an ALD process technology. The composition of the blocking layer is selected such that the blocking layer remains amorphous (<about 30% crystalline as determined by x-ray diffraction (XRD)) after subsequent annealing treatments. The blocking layer needs to be thick enough that it forms a continuous layer. Therefore, the minimum thickness is about 0.5 nm. Additionally, the blocking layer should be thin enough that it remains amorphous after subsequent annealing treatments. Therefore, the maximum thickness is about 2.0 nm. Advantageously, the thickness of the blocking layer is in the range from about 0.7 nm to about 1.5 nm. The thickness of the blocking layer is typically less than or equal to about 25% of the total dielectric thickness of the DRAM MIM capacitor.

The substrate with the first electrode layer, first interface layer, a doped high k dielectric layer, second interface layer, and an amorphous blocking layer is then annealed in an oxidizing atmosphere including between about 0% $O_2$ to about 100% $O_2$ in $N_2$ and advantageously between about 0% $O_2$ to about 20% $O_2$ in $N_2$ at temperatures between about 300 C to about 600 C for between about 1 millisecond to about 60 minutes. The doped high k dielectric layer will be crystalline (> about 30% crystalline as determined by XRD) after the anneal.

In the next step, the second electrode layer, 312, is formed above blocking layer, 310 to complete the formation of the capacitor stack. The second electrode layer may include one of, metals, metal alloys, conductive metal oxides, conductive metal nitrides, conductive metal silicides, or combinations thereof, etc. Examples of suitable materials for the second electrode layer include cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof. The capacitor stack may receive a PMA treatment as discussed previously.

DRAM MIM capacitors with the configuration illustrated in FIG. 3 will exhibit low leakage current due to the current blocking properties of the amorphous blocking layer. The higher band gap (i.e. > about 4.8 eV) of the blocking layer reduces the leakage current due to the Schottky emission mechanism. The barrier height between the amorphous blocking layer and the second electrode also reduces the leakage current due to the Schottky emission mechanism. Additionally, the DRAM MIM capacitor will exhibit low EOT values due to the high k value of the crystalline, doped high k dielectric layer. A further benefit of the DRAM MIM capacitor stack illustrated in FIG. 3 is that it is easy to integrate into existing DRAM manufacturing process flows. The use, treatment, materials compatibility, reliability, etc. of metal nitride second electrode materials are well established. Therefore, the DRAM MIM capacitor stack illustrated in FIG. 3 represents an opportunity to extend the benefits and the high k properties of doped zirconium oxide into the DRAM MIM manufacturing process of future device technologies without having to adapt to the use of new materials.

Figure 4:
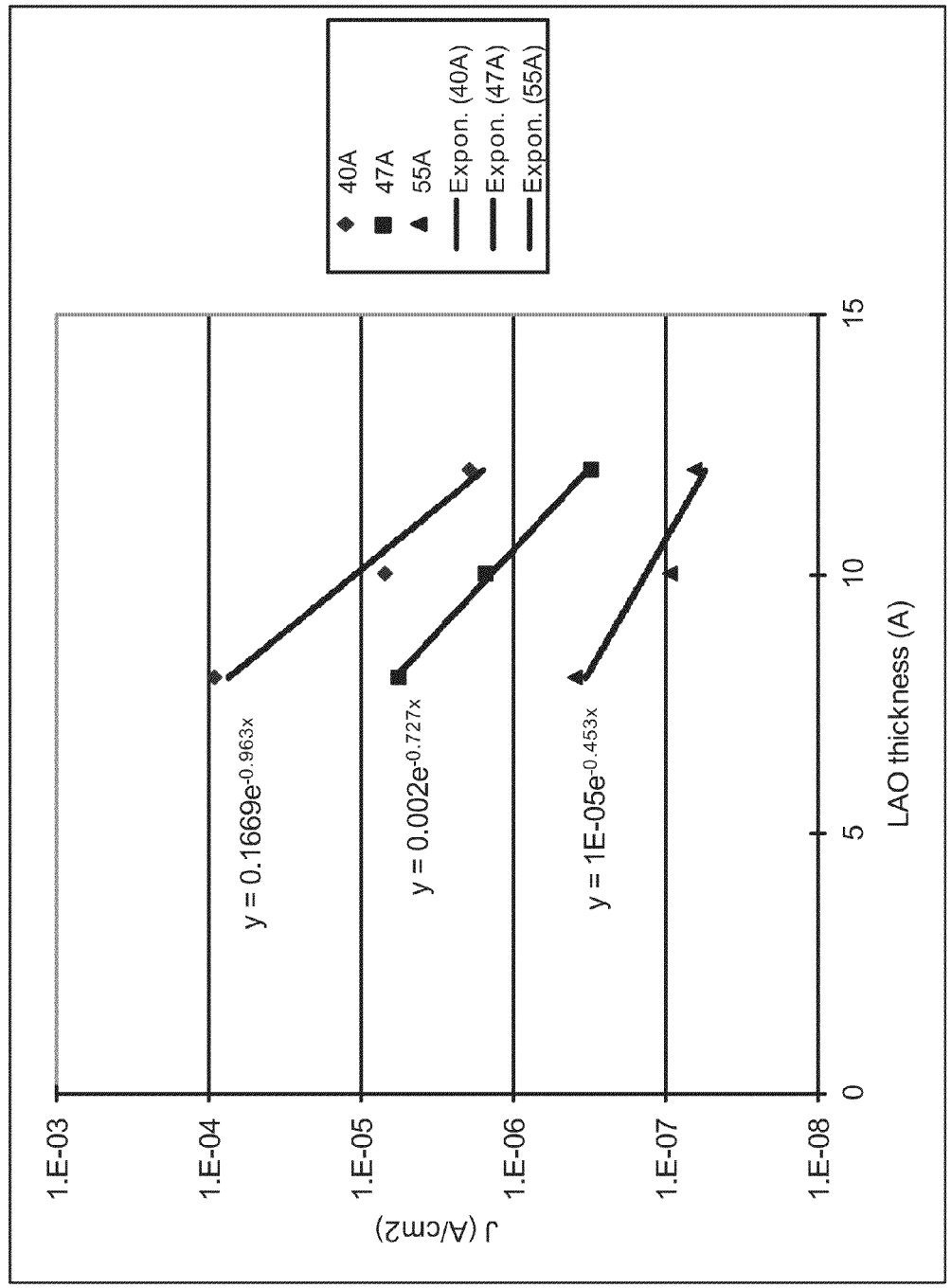
FIG. 4 presents data for J versus LAO thickness in accordance with some embodiments.

FIG. 4 presents leakage current density versus the thickness of the lanthanum-aluminum-oxide (LAO) blocking layer data for a DRAM MIM capacitor stack formed with the configuration illustrated in FIG. 3. The capacitor stack included a 500 A first electrode layer of titanium nitride. A first interface layer included 6 A of titanium oxide. The dielectric layer included zirconium oxide. Three zirconium oxide thicknesses were tested, including 40 A, 47 A, and 55 A. The second interface layer included 1 A of aluminum oxide. The amorphous blocking layer included lanthanum-aluminum-oxide. Three lanthanum-aluminum-oxide thicknesses were tested, including 8 A, 10 A, and 12 A. The capacitor stack included a 500 A second electrode layer of titanium nitride. The data for the stacks with the 40 A zirconium oxide dielectric layer are represented by the diamonds. The data for the stacks with the 47 A zirconium oxide dielectric layer are represented by the squares. The data for the stacks with the 55 A zirconium oxide dielectric layer are represented by the triangles. Within each of these three data sets, the leakage current density decreased as the LAO layer thickness increased. The slope of the three data sets varies from −0.453 (for the 55 A zirconium oxide data) to −0.963 (for the 40 A zirconium oxide data).

Figure 5:
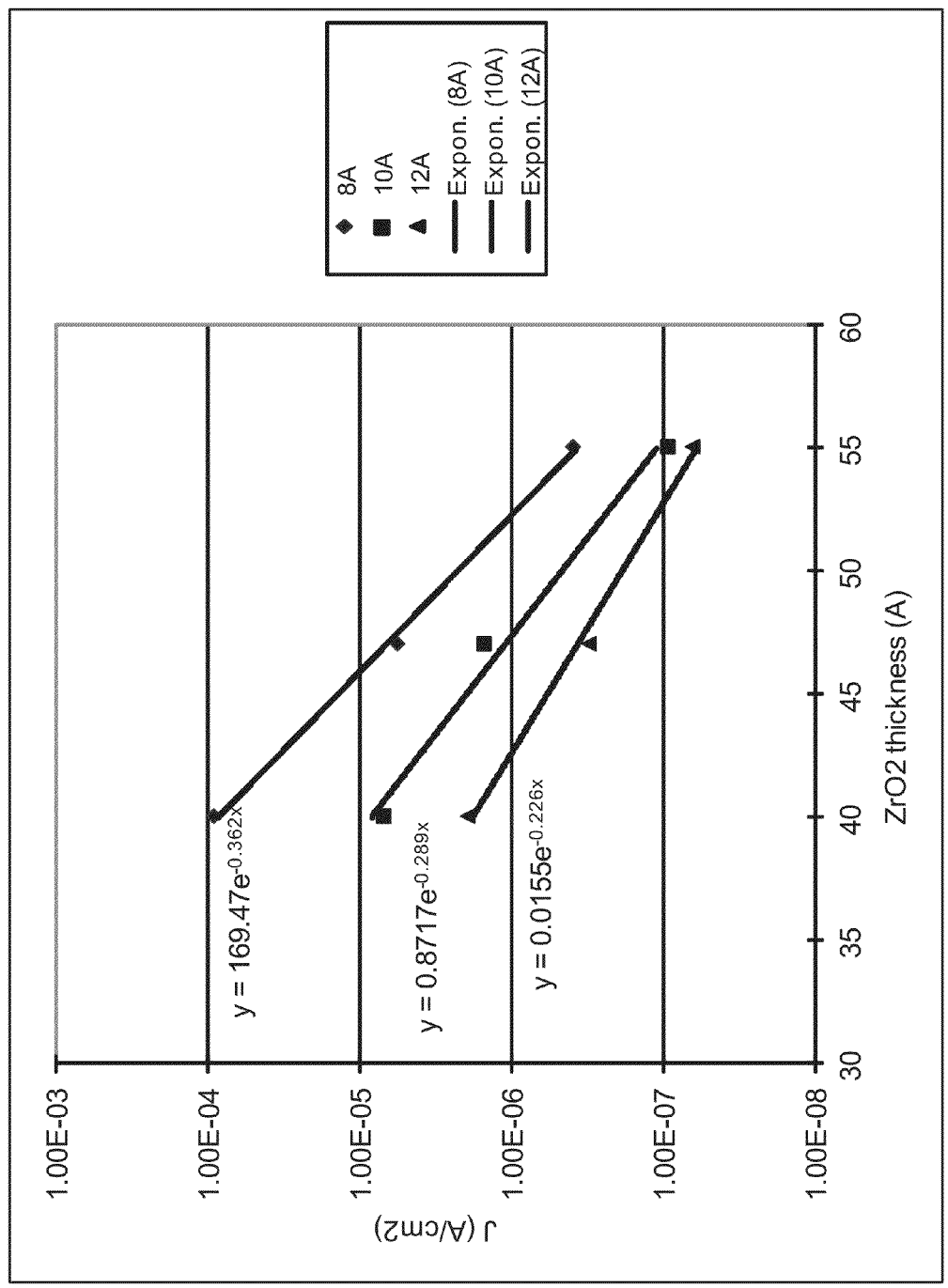
FIG. 5 presents data for J versus $ZrO_2$ thickness in accordance with some embodiments.

FIG. 5 presents leakage current density versus the thickness of the $ZrO_2$ layer data for a DRAM MIM capacitor stack formed with the configuration illustrated in FIG. 3. The capacitor stack included a 500 A first electrode layer of titanium nitride. A first interface layer included 6 A of titanium oxide. The dielectric layer included zirconium oxide. Three zirconium oxide thicknesses were tested, including 40 A, 47 A, and 55 A. The second interface layer included 1 A of aluminum oxide. The amorphous blocking layer included lanthanum-aluminum-oxide (LAO). Three LAO thicknesses were tested, including 8 A, 10 A, and 12 A. The capacitor stack included a 500 A second electrode layer of titanium nitride. The data for the stacks with the 8 A LAO layer are represented by the diamonds. The data for the stacks with the 10 A LAO layer are represented by the squares. The data for the stacks with the 12 A LAO layer are represented by the triangles. Within each of these three data sets, the leakage current density decreased as the zirconium oxide layer thickness increased. The slope of the three data sets varies from −0.226 (for the 12 A lanthanum-aluminum-oxide data) to −0.362 (for the 8 A lanthanum-aluminum-oxide data).

The data in FIG. 4 and FIG. 5 indicate the relative sensitivity of the leakage current density to the thickness of the lanthanum-aluminum-oxide blocking layer thickness and the zirconium oxide layer thickness respectively. The slopes of the lines used to fit the data in FIG. 4 are larger (i.e. steeper) than the slopes of the lines used to fit the data in FIG. 5. This indicates that varying the lanthanum-aluminum-oxide blocking layer thickness is more effective at lowering the leakage current density than varying the zirconium oxide layer thickness. This trend is especially true for cases where the zirconium oxide layer thickness is very thin (i.e. the 40 A and 47 A data) where the slopes of the lines are the greatest (see FIG. 4). Therefore, ternary metal oxide blocking layers can be used effectively to reduce the leakage current density in DRAM capacitors.

Figure 6:
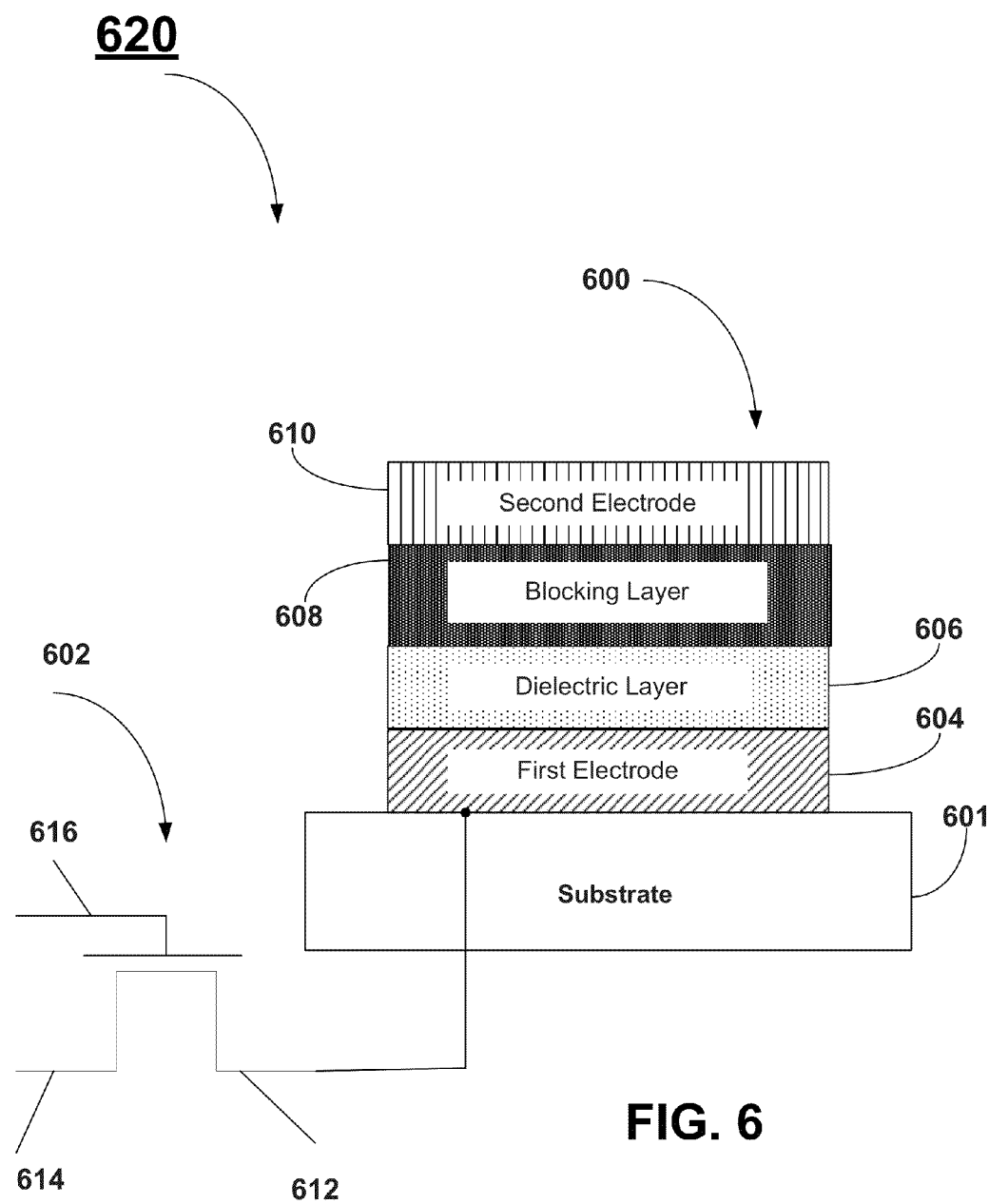
FIG. 6 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 6 is used to illustrate one DRAM cell, 620, manufactured using a dielectric structure as discussed previously. The cell, 620, is illustrated schematically to include two principle components, a cell capacitor, 600, and a cell transistor, 602. The cell transistor is usually constituted by a MOS transistor having a gate, 616, source, 612, and drain, 614. The gate is usually connected to a word line and one of the source or drain is connected to a bit line. The cell capacitor has a lower or storage electrode, 604, and an upper or plate electrode, 610. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 600, includes a first electrode layer, 604, formed above substrate, 601. The first electrode layer, 604, is connected to the source or drain of the cell transistor, 602. For illustrative purposes, the first electrode has been connected to the source, 612, in this example. As discussed previously, first electrode layer, 604, may be subjected to an anneal before the formation of the dielectric layer if the first electrode layer is a conductive metal oxide such as molybdenum oxide. Crystalline, doped high k dielectric layer, 606, is formed above the first electrode layer. If the crystalline, doped high k dielectric layer is titanium oxide, then the dielectric layer will be doped so that the rutile phase of titanium oxide can be formed on the bottom electrode. Typical dopants for titanium oxide include Al, Ce, Co, Er, Ga, Gd, Ge, Hf, In, La, Lu, Mg, Mn, Nd, Pr, Sc, Si, Sn, Sr, Y, Zr, or combinations thereof. Amorphous blocking layer,

608, is formed above the dielectric layer. The blocking layer is formed using an ALD process technology. The blocking layer may be highly doped so that it will remain amorphous (<30% crystalline) after subsequent anneal steps. Examples of suitable blocking layer materials include ternary metal oxides such as $LaAlO_3$, $GdScO_3$, $SrZrO_4$, $LaLuO_3$, $DyScO_3$, $HfLaO_x$, $ZrLaO_x$, $TiLaO_x$ or combinations thereof. The blocking layer should have a band gap greater than about 4.8 eV. Typically, the first electrode layer, the high k dielectric layer, and the blocking layer are then subjected to a PDA treatment. The second electrode layer, 610, is then formed above the blocking layer. This completes the formation of the capacitor stack. Typically, the capacitor stack is then subjected to a PMA treatment.

FIG. 6 will be used to describe a second example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. The cell, 620, is illustrated schematically to include two principle components, a cell capacitor, 600, and a cell transistor, 602. The cell transistor is usually constituted by a MOS transistor having a gate, 616, source, 612, and drain, 614. The gate is usually connected to a word line and one of the source or drain is connected to a bit line. The cell capacitor has a lower or storage electrode, 604, and an upper or plate electrode, 610. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 600, includes a first electrode layer, 604, formed on substrate, 601. The first electrode layer, 604, is connected to the source or drain of the cell transistor, 602. For illustrative purposes, the first electrode has been connected to the source, 612, in this example. As discussed previously, first electrode layer, 604, may be subjected to a pretreatment before the formation of the dielectric layer if the first electrode layer is a conductive metal nitride such as titanium nitride. Crystalline, doped high k dielectric layer, 606, is formed above the first electrode layer. If the crystalline, doped high k dielectric layer is zirconium oxide, then the dielectric layer will be doped so that the tetragonal phase of zirconium oxide can be formed on the bottom electrode. Typical dopants for zirconium oxide include Al, Ce, Co, Er, Ga, Gd, Ge, Hf, In, La, Lu, Mg, Mn, Nd, Pr, Sc, Si, Sn, Sr, Y, or combinations thereof. Amorphous blocking layer, 608, is formed above the dielectric layer. The blocking layer may be highly doped so that it will remain amorphous (<30% crystalline) after subsequent anneal steps. Examples of suitable blocking layer materials include ternary metal oxides such as $LaAlO_3$, $GdScO_3$, $SrZrO_4$, $LaLuO_3$, $DyScO_3$, $HfLaO_x$, $ZrLaO_x$, $TiLaO_x$ or combinations thereof. The blocking layer is formed using an ALD process technology. The blocking layer should have a band gap greater than about 4.8 eV. Typically, the first electrode layer, the high k dielectric layer, and the blocking layer are then subjected to a PDA treatment. The second electrode layer, 610, is then formed above the blocking layer. This completes the formation of the capacitor stack. Typically, the capacitor stack is then subjected to a PMA treatment.

Figure 7:
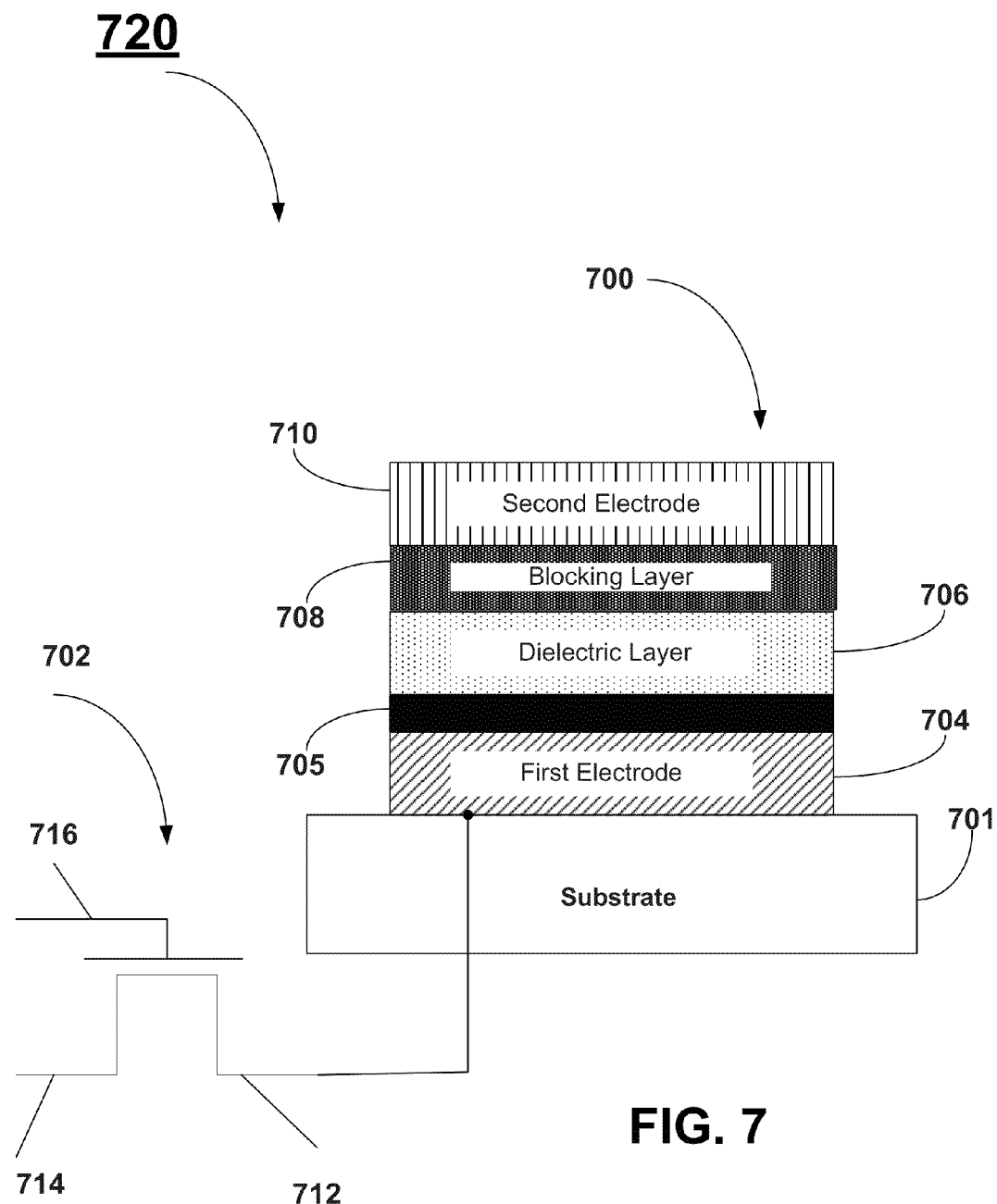
FIG. 7 illustrates a simplified cross-sectional view of a DRAM memory cell fabricated in accordance with some embodiments.

An example of a specific application of some embodiments is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 7 is used to illustrate one DRAM cell, 720, manufactured using a dielectric structure as discussed previously. The cell, 720, is illustrated schematically to include two principle components, a cell capacitor, 700, and a cell transistor, 702. The cell transistor is usually constituted by a MOS transistor having a gate, 716, source, 712, and drain, 714. The gate is usually connected to a word line and one of the source or drain is connected to a bit line. The cell capacitor has a lower or storage electrode, 704, and an upper or plate electrode, 710. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 700, includes a first electrode layer, 704, formed on substrate, 701. The first electrode layer, 704, is connected to the source or drain of the cell transistor, 702. For illustrative purposes, the first electrode has been connected to the source, 712, in this example. As discussed previously, first electrode layer, 704, may be subjected to a pretreatment before the formation of the dielectric layer if the first electrode layer is a conductive metal nitride such as titanium nitride. First interface layer, 705, is formed above the first electrode layer as discussed previously. The first interface layer is formed using an ALD process technology. Crystalline, doped high k dielectric layer, 706, is formed above the first interface layer. If the crystalline, doped high k dielectric layer is zirconium oxide, then the dielectric layer will be doped so that the tetragonal phase of zirconium oxide can be formed on the first interface layer. Typical dopants for zirconium oxide include Al, Ce, Co, Er, Ga, Gd, Ge, Hf, In, La, Lu, Mg, Mn, Nd, Pr, Sc, Si, Sn, Sr, Y, or combinations thereof. Amorphous blocking layer, 708, is formed above the second interface layer. The blocking layer may be highly doped so that it will remain amorphous (<30% crystalline) after subsequent anneal steps. Examples of suitable blocking layer materials include ternary metal oxides such as $LaAlO_3$, $GdScO_3$, $SrZrO_4$, $LaLuO_3$, $DyScO_3$, $HfLaO_x$, $ZrLaO_x$, $TiLaO_x$ or combinations thereof. The blocking layer is formed using an ALD process technology. The blocking layer should have a band gap greater than about 4.8 eV. Typically, the first electrode layer, the first interface layer, the high k dielectric layer, the second interface layer, and the blocking layer are then subjected to a PDA treatment. The second electrode layer, 710, is then formed above the blocking layer. This completes the formation of the capacitor stack. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
forming a first layer on a substrate,
wherein the first layer is operable as an electrode;
forming a second layer on the first layer,
wherein the second layer comprises a dielectric material, and
wherein the second layer further comprises a dopant;
forming a third layer on the second layer,
wherein the third layer is operable as a blocking layer,
wherein the third layer comprises a ternary metal oxide, and
wherein the k value of the third layer is between 20 and 50 and the band gap of the third layer is greater than 4.8 eV;
after forming the third layer, annealing the first layer, the second layer, and the third layer at a temperature of between about 300 C and 600 C in an oxidizing atmosphere including between about 0% $O_2$ and 20% $O_2$,
wherein the second layer is crystalline after annealing,
wherein the third layer is amorphous after annealing; and
after annealing the first layer, the second layer, and the third layer, forming a fourth layer on the third layer,
wherein the fourth layer is operable as an electrode.

2. The method of claim 1 wherein the first layer is one of a metal, metal alloy, conductive metal oxide, conductive metal silicide, conductive metal carbides, conductive metal nitride, or combinations thereof.

3. The method of claim 2 wherein the first layer is a conductive metal oxide comprising one of molybdenum oxide, tungsten oxide, ruthenium oxide, iron oxide, iridium oxide, chromium oxide, manganese oxide, tin oxide, cobalt oxide, or nickel oxide.

4. The method of claim 3 wherein the conductive metal oxide is molybdenum oxide.

5. The method of claim 1 wherein the dielectric material comprises one of aluminum oxide, barium-strontium-titanate (BST), hafnium oxide, hafnium silicate, niobium oxide, lead-zirconium-titanate (PZT), a bilayer of silicon oxide and silicon nitride, silicon oxy-nitride, strontium-titanate (STO), tantalum oxide, titanium oxide, zirconium oxide, or doped versions of the same.

6. The method of claim 5 wherein the dielectric material comprises a dopant, wherein the dopant comprises one of Al, Ce, Co, Er, Ga, Gd, Ge, Hf, In, La, Lu, Mg, Mn, Nd, Pr, Sc, Si, Sn, Sr, Y, Zr, or combinations thereof.

7. The method of claim 1 wherein the third layer comprises one of $LaAlO_3$, $GdScO_3$, $SrZrO_4$, $LaLuO_3$, $DyScO_3$, $HfLaO_x$, $ZrLaO_x$, $TiLaO_x$ or combinations thereof.

8. The method of claim 1 wherein a thickness of the third layer is thinner than a thickness of the second layer.

9. The method of claim 1 wherein a thickness of the third layer is less than 2.0 nm.

10. The method of claim 1 wherein a thickness of the third layer is between 0.7 nm and 1.5 nm.

11. The method of claim 1 wherein a thickness of the third layer is less or equal to 25% of a combined thickness of the second layer, and the third layer.

12. The method of claim 1 wherein the fourth layer comprises one of cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof.

13. The method of claim 1 wherein the first layer is subjected to an annealing treatment before the formation of the second layer.

14. The method of claim 1 wherein the first layer, the second layer, the third layer, and the fourth layer are subjected to an annealing treatment after the formation of the fourth layer.

15. A method for forming a capacitor stack, the method comprising:
forming a first layer on a substrate,
wherein the first layer is operable as an electrode, and
wherein the first layer comprises molybdenum oxide;
forming a second layer on the first layer,
wherein the second layer comprises a dielectric material,
wherein the second layer comprises a dopant, and
wherein the second layer is more than 30% crystalline after a subsequent annealing treatment;
forming a third layer on the second layer,
wherein the third layer is operable as a blocking layer,
wherein the third layer comprises $LaAlO_3$, and;
after forming the third layer, annealing the first layer, the second layer, and the third layer at a temperature of between about 300 C and 600 C in an oxidizing atmosphere including between about 0% $O_2$ and 20% $O_2$,
wherein the second layer is crystalline after annealing,
wherein the third layer is amorphous after annealing; and
after annealing the first layer, the second layer, and the third layer, forming a fourth layer on the third layer,
wherein the fourth layer is operable as an electrode.

16. The method of claim 15 further comprising annealing the first layer before the forming of the second layer.

17. The method of claim 15 wherein the first layer, second layer, third layer and fourth layer are subjected to an annealing treatment after the forming of the fourth layer.

18. The method of claim 15 wherein the fourth layer comprises one of cobalt, cobalt nitride, iridium, molybdenum nitride, molybdenum oxide, nickel, nickel nitride, nickel oxide, platinum, palladium, ruthenium, ruthenium oxide, tantalum nitride, titanium nitride, tungsten nitride, vanadium nitride, or combinations thereof.

19. The method of claim 1, wherein the third layer comprises $LaAlO_3$.

20. The method of claim 19, wherein the dielectric material comprises zirconium oxide.

* * * * *